United States Patent
Ju et al.

(10) Patent No.: US 8,842,395 B2
(45) Date of Patent: Sep. 23, 2014

(54) MAGNETIC SENSOR HAVING AN EXTENDED PINNED LAYER AND SHAPE ENHANCED BIAS STRUCTURE

(71) Applicant: HGST Netherlands B.V., Amsterdam (NL)

(72) Inventors: Kochan Ju, Monte Sereno, CA (US); Quang Le, San Jose, CA (US); Simon H. Liao, Fremont, CA (US); Guangli Liu, Pleasanton, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/720,959

(22) Filed: Dec. 19, 2012

(65) Prior Publication Data

US 2014/0168824 A1  Jun. 19, 2014

(51) Int. Cl.
*G11B 5/39* (2006.01)

(52) U.S. Cl.
CPC .................................... *G11B 5/3906* (2013.01)
USPC .................................................. 360/324.12

(58) Field of Classification Search
CPC ...................... G11B 2005/3996; G11B 5/3909; G11B 5/3932; G11B 5/3906; G11B 5/398
USPC .............................................. 360/324–324.2
See application file for complete search history.

(56) References Cited

U.S. PATENT DOCUMENTS

| | | | |
|---|---|---|---|
| 7,365,949 B2 * | 4/2008 | Hayakawa et al. ......... | 360/324.1 |
| 7,369,371 B2 * | 5/2008 | Freitag et al. ............. | 360/324.11 |
| 7,420,787 B2 * | 9/2008 | Freitag et al. ............. | 360/324.1 |
| 7,436,637 B2 * | 10/2008 | Pinarbasi ................. | 360/324.11 |
| 7,522,391 B2 | 4/2009 | Freitag et al. | |
| 7,602,589 B2 * | 10/2009 | Freitag et al. ............. | 360/324.11 |
| 7,652,856 B2 * | 1/2010 | Pinarbasi ................. | 360/324.11 |
| 7,663,846 B2 | 2/2010 | Freitag et al. | |
| 7,920,357 B2 | 4/2011 | Sato et al. | |
| 8,031,442 B2 * | 10/2011 | Pinarbasi ................... | 360/324.1 |
| 8,068,317 B2 * | 11/2011 | Gill ........................... | 360/324.2 |
| 8,194,366 B1 * | 6/2012 | Li et al. ...................... | 360/324.2 |
| 2007/0206333 A1 * | 9/2007 | Watanabe et al. ............ | 360/313 |
| 2009/0021870 A1 * | 1/2009 | Pinarbasi ................. | 360/324.11 |
| 2013/0049747 A1 * | 2/2013 | Zhou et al. ..................... | 324/252 |
| 2013/0083432 A1 * | 4/2013 | Le et al. ..................... | 360/235.4 |
| 2013/0163121 A1 * | 6/2013 | Le et al. ..................... | 360/235.4 |

OTHER PUBLICATIONS

Nagahama et al., "Enhanced magneto-transport at high bias in quasi-magnetic tunnel junctions with EuS spin-filter barriers," Phys. Rev. Lett, vol. 99, 2007, pp. 1-4.
Smith, N., "Micromagnetic modeling of magnoise in magnetoresistive read sensors," 2008 Elsevier B.V., 2009 Journal of Magnetism and Magnetic Materials, vol. 321, pp. 531-538.

* cited by examiner

*Primary Examiner* — Will J Klimowicz
(74) *Attorney, Agent, or Firm* — Zilka-Kotab, PC

(57) ABSTRACT

A magnetic read sensor having an extended pinned layer structure and also having an extended free layer structure. The extended pinned layer structure and extended free layer structure both extend beyond the strip height of the free layer of the sensor to provide improved pinning strength as well as improved free layer biasing reliability and bias field strength.

5 Claims, 26 Drawing Sheets

MAGNETIC SENSOR HAVING AN EXTENDED PINNED LAYER AND SHAPE ENHANCED BIAS STRUCTURE

FIELD OF THE INVENTION

The present invention relates to magnetic data recording and more particularly to a magnetic read sensor having improved free layer and pinned layer stability through use of an extended pinned layer structure and a shape enhanced magnetic bias structure.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresivise (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the track width of the system as well as the bit length. This requires reducing the size of the read sensor. However, as the read sensor becomes smaller, the stability of the magnetization of the free layer and the pinned layer structures suffers. Therefore, there remains a need for a structure that can maintain both free layer stability and pinned layer stability. There also remains a need for a manufacturing process that can make construction of such a sensor structure practical.

SUMMARY OF THE INVENTION

The present invention provides a magnetic read sensor that includes a sensor stack having a magnetic pinned layer structure, a magnetic free layer structure and a non-magnetic layer disposed between the magnetic pinned layer structure and magnetic free layer structure. The sensor stack has first and second sides, and the free layer has a back edge terminating at a stripe height as measured from an air bearing surface. The pinned layer structure has an extended portion that extends beyond the stripe height. The read sensor also has first and second hard bias structures that are separated from the first and second sides of the sensor stack by first and second insulation layers and that extend beyond the stripe height of the free layer.

Extending both the hard bias structure and the pinned layer structure beyond the free layer stripe height advantageously improves pinning strength and reliability as well as free layer biasing strength and reliability. Further improvement in pinned layer pinning and free layer biasing can be achieved by making the pinned layer and hard bias taper laterally outward in the extended portion that extends beyond the free layer stripe height.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
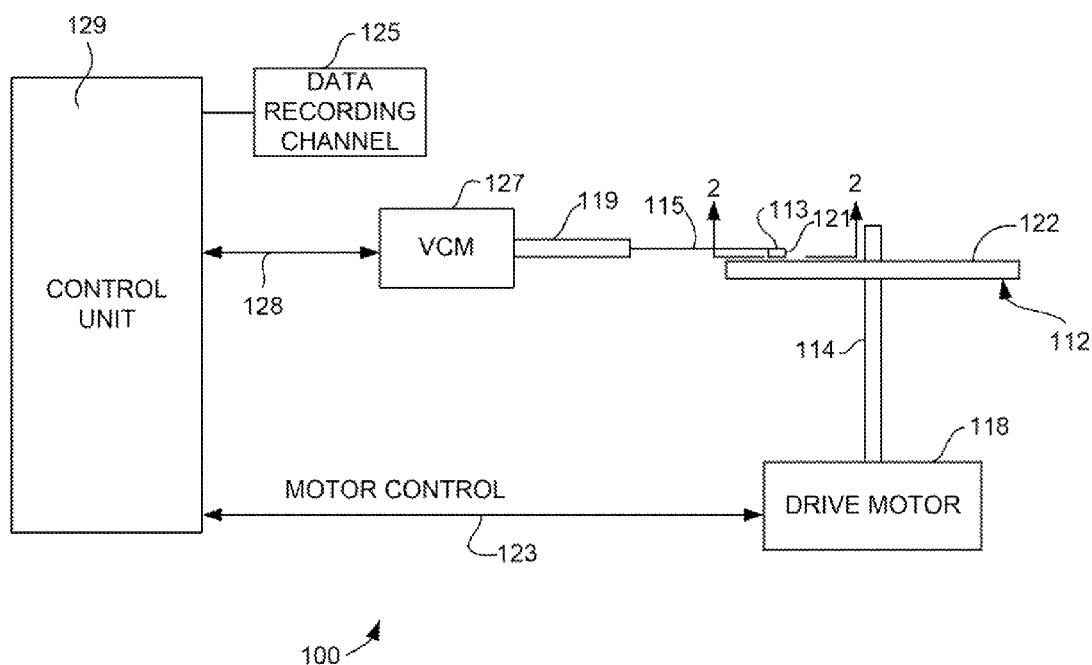
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
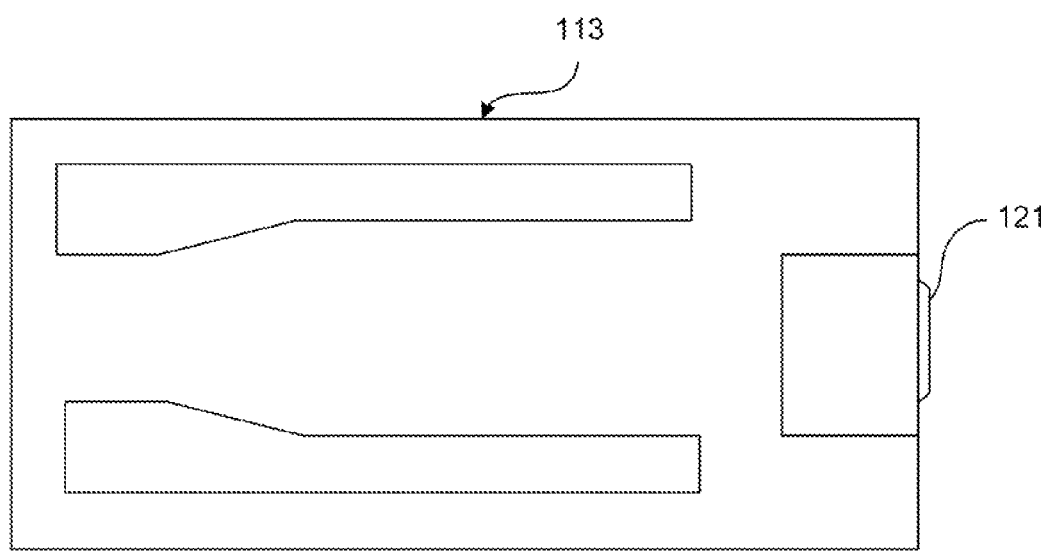
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
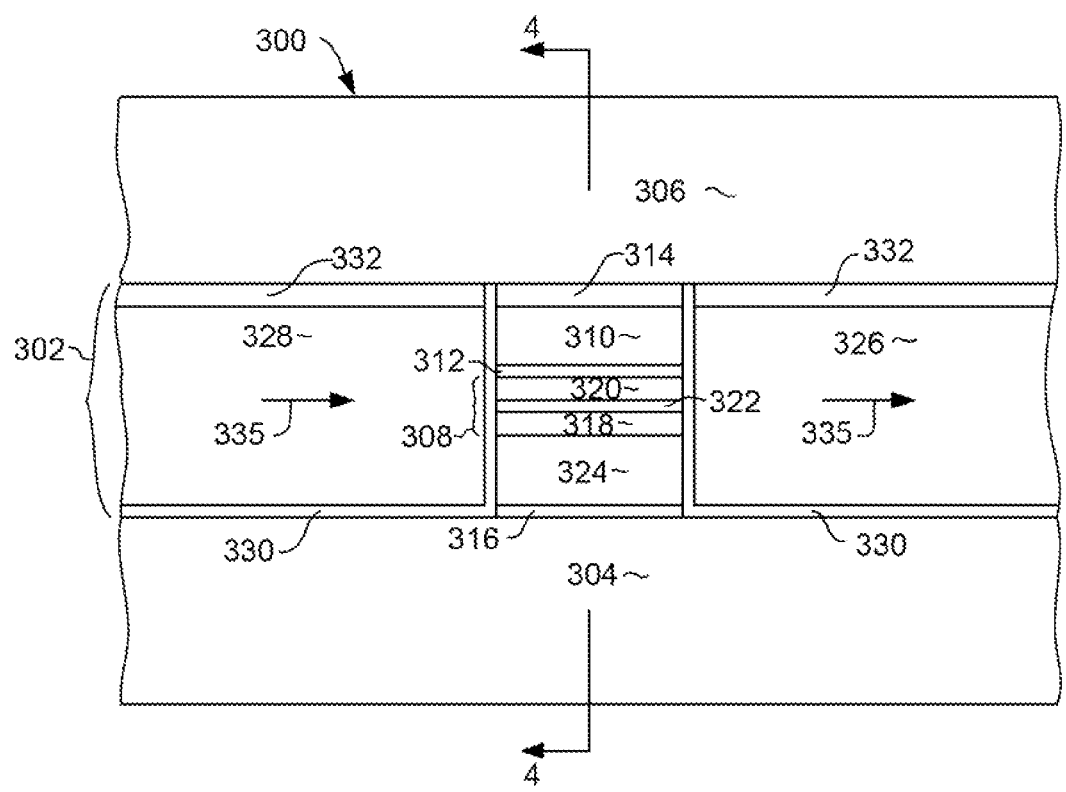
FIG. 3 is an air bearing surface view of a magnetic read sensor according to an embodiment of the invention.

FIG. 3 shows a schematic view of a magnetic read head 300 as viewed from the air bearing surface. The read head 300 includes a sensor stack 302 that is sandwiched between a leading magnetic shield 304 and a trailing magnetic shield 306. The sensor stack 302 includes a magnetic pinned layer structure 308, a magnetic free layer structure 310 and a non-magnetic barrier or spacer layer 312 sandwiched between the free and pinned layer structures 308, 310. If the sensor 302 is a tunnel junction (TMR) sensor, then the layer 312 can be a non-magnetic, electrically insulating barrier layer such as MgO. If the sensor 302 is a giant magnetoresistive (GMR) sensor, the layer 312 can be a non-magnetic, electrically conductive material such as AgSn. A capping layer 314 may be provided at the top of the sensor stack 302 to protect the under-lying layers during manufacture. A seed layer 316 may also be provided at the bottom of the sensor stack 302 to promote a desired grain structure in the other above applied layers of the sensor stack 302.

The pinned layer structure 308 can be an anti-parallel coupled structure that includes first and second magnetic layers 318, 320 that are anti-parallel coupled across a non-magnetic, anti-parallel coupling layer such as Ru 322. The first magnetic layer 318 contacts and is exchange coupled with a layer of antiferromagnetic material 324 such as Ir—Mn. This exchange coupling pins the magnetization of the first magnetic layer 318 in a first direction that is perpendicular to the air bearing surface. The anti-parallel coupling between the first and second magnetic layers 318, 320 across the anti-parallel coupling layer 322 causes the magnetization of the second magnetic layer 320 to be pinned in a second direction perpendicular to the air bearing surface and opposite to the first direction.

The free layer 310 has a magnetization that is biased in a direction that is parallel with the air bearing surface and orthogonal to the directions of magnetization of the pinned layers 318, 320, but which is free to move in response to an external magnetic field. Biasing of the magnetization of the free layer 310 is provided by hard magnetic bias layers 326, 328, which can be constructed of a high magnetic coercivity material such as CoPt or CoPtCr. The hard bias layer 326, 328 are separated from the sensor stack 302 by non-magnetic, electrically insulating layers 330, which can be constructed of one or more layers of material such as alumina ($Al_2O_3$), SiN, TaOx, MgO, SiOxNy, or a combination thereof. A non-magnetic hard bias capping layer 332 can be provided at the top of each of the hard magnetic bias layers 326, 328. These capping layers 332 can be constructed of a material such as Ta/Ru, Ta/Cr, Ta/Rh, or a combination thereof, which protects the hard bias layers 326, 328. The hard bias layers 326, 328 have a magnetization that is oriented in a desired direction parallel with the ABS as indicated by arrows 335.

Figure 4:
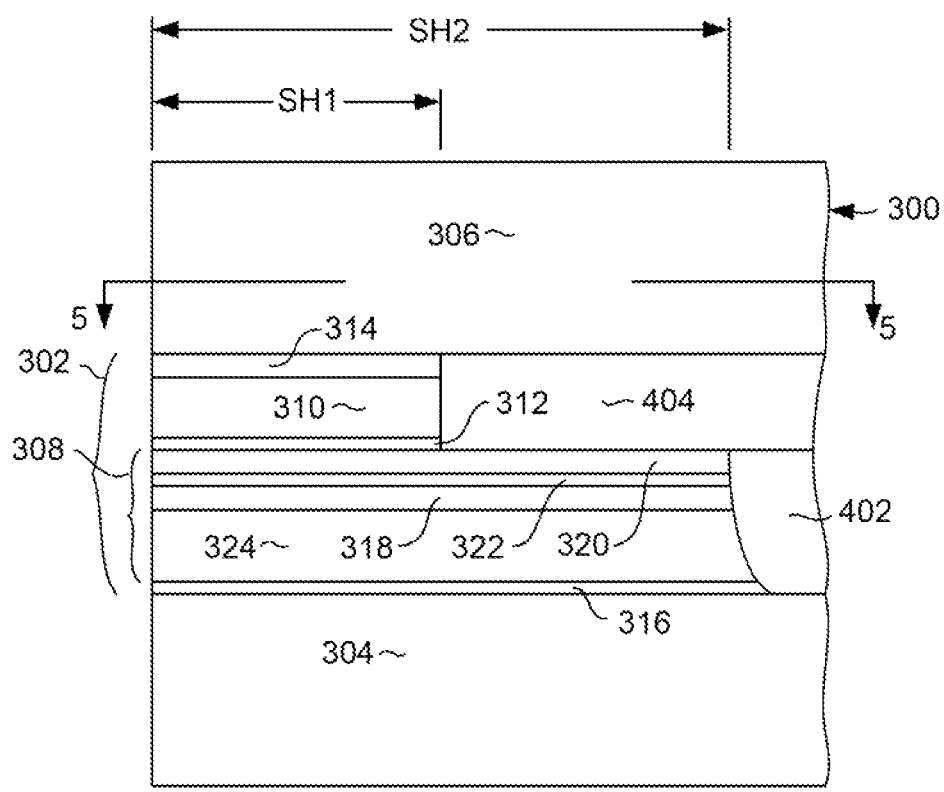
FIG. 4 is a side cross sectional view of the magnetic read sensor of FIG. 3 as seen from line 4-4 of FIG. 3.

FIG. 4 shows a side cross sectional view of the sensor 300. As can be seen in FIG. 4, the free layer 310 and capping layer 314 extend to a first stripe height SH1, whereas the pinned layer structure 308 and AFM layer 324 extend further to a second stripe height SH2. The first stripe height SH1 defines the functional stripe height of the sensor. The extended stripe height SH2 of the pinned layer structure 308 and AFM layer 324 improve the pinning strength of the pinned layer, through an additional shape enhanced magnetic anisotropy, as well as additional exchange coupling between the pinned layer structure 308 and AFM layer 324. The space behind the pinned layer structure 308 can be filled with a non-magnetic, electrically insulating material such as alumina. Similarly, the space behind the free layer structure 310 can also be filled with a non-magnetic, electrically insulating material such as a multilayer consisting of one layer of alumina and another layer of TaOx, SixNy, or combination. A certain amount of minimal alumina thickness is needed to ensure high breakdown property (e.g. sufficient electrical insulation), while the other layers either TaO, SiN, or combination is to provide a high ion mill rate material to ensure that ion milling etches through these materials to open space for a hard bias layer to be deposited, as will be seen.

Figure 5:
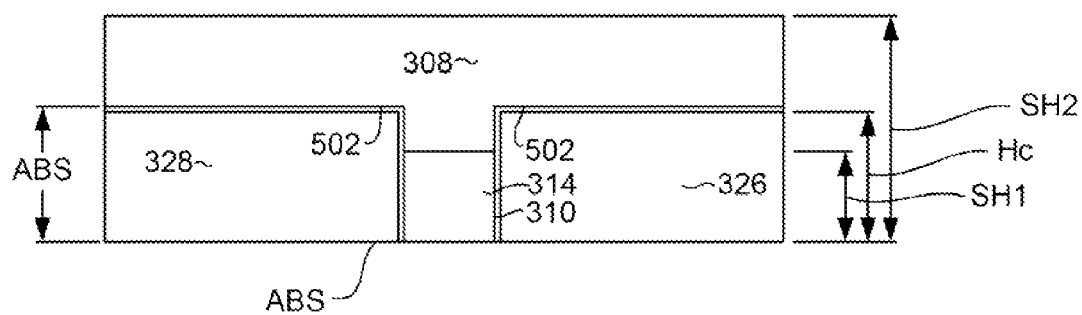
FIG. 5 is a top down view of the magnetic read sensor of FIGS. 3 and 4 as seen from line 5-5 of FIG. 4.
Figure 5A:
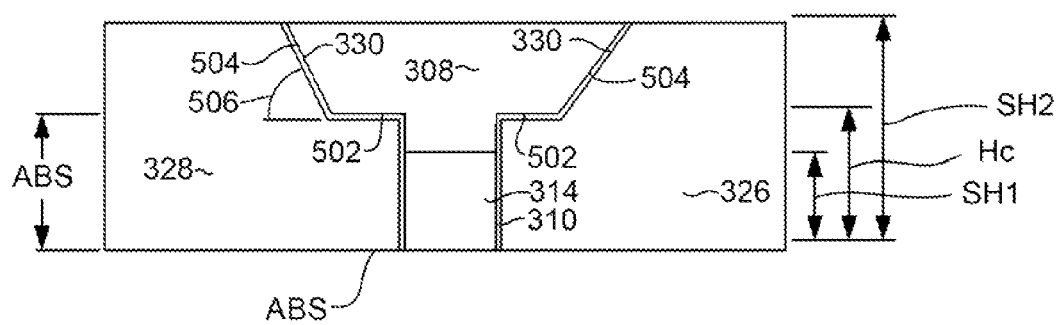
FIG. 5a is a top down view similar to that of FIG. 5, illustrating an alternate embodiment of the invention.

FIG. 5 shows a top down view of the magnetic sensor of FIGS. 3 and 4 as seen from line 5-5 of FIG. 4. In FIG. 5 it can be seen that the capping layer 314 (and free layer 310 hidden there-beneath) extend to the first stripe height SH1, and the pinned layer structure 308 extends beyond the first stripe height SH1. It can also be seen that the hard bias layers 326, 328 are extended in the stripe height direction so that they extend beyond the first stripe height SH1. This configuration, therefore, not only provides additional pinning strength for maintaining robust pinned layer pinning, but also provides additional magnetic bias field, additional hard bias stability, and controlled hard bias length for optimal hard bias' coercivity ($H_c$). The additional hard bias material 326, 328 increases the strength of the magnetic bias field, and the extension of the hard bias layer 326, 328 also provides additional shape enhanced magnetic anisotropy to ensure that the magnetization of the hard bias layers remains oriented as desired, $H_c$.

Figure 6:
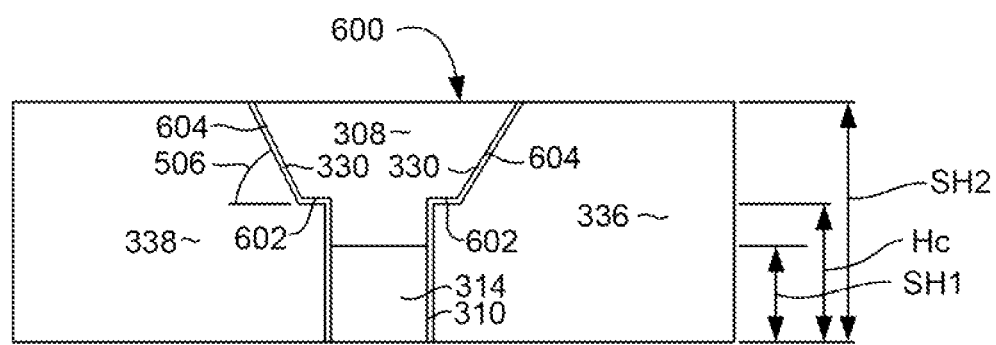
FIG. 6 is a top down view illustrating another embodiment of the invention.
Figure 7:
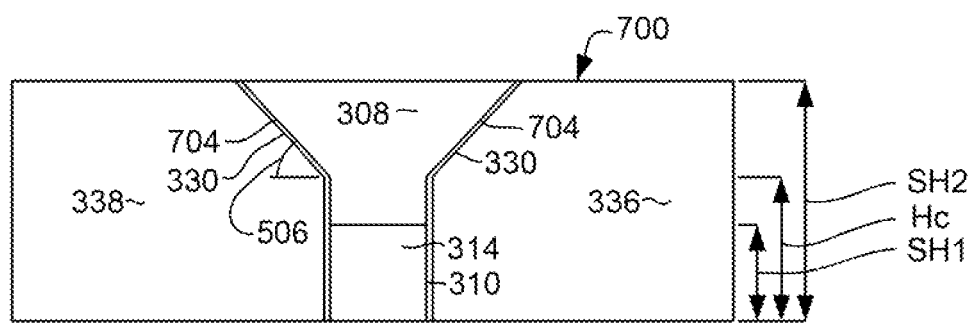
FIG. 7 is a top down view illustrating another alternate of the invention.

In FIG. 5 it can also be seen that at the location at or near the first stripe height SH1, both the pinned layer structure 308 and the hard bias structures 326, 328 extend laterally outward in a direction that is substantially parallel with the ABS along an edge 502. It can also be seen in FIGS. 5a, 6, and 7 that the pinned layer also has a tapered edge 504 that tapers at away from the ABS at an angle that is neither parallel with nor perpendicular to the ABS. It can also be seen that the hard bias has a tapered back edge that follows the taper of the edge 504 of the extended pinned layer 308. The tapered portions of the pinned layer 308 and hard bias layers 326, 328 preferably define an angle 506 that is 30-60 degrees, or more preferably about 45 degrees, with respect to a plane that is parallel with the air bearing surface (ABS). FIG. 5 shows the optimal design where the hard bias length is well defined to achieve optimal hard bias field and hard bias coercivity. FIGS. 5, 5a, 6, and 7 show different shapes of hard bias. Increasing the "wing" shape would further increase hard bias field but at expense of hard bias coercivity. Depending on design, FIGS. 5, 6, and 7 offer options to further adjust between coercivity and hard bias field. With reference now to FIG. 6, an alternate embodiment of the invention is shown. FIG. 6 shows a sensor 600 that has a laterally extending portion 602 that is smaller than the laterally extending portion 502 of FIG. 5. FIG. 7 shows a sensor 700 according to another embodiment of the invention. In this embodiment the tapered portion 704 forms a "Y" shaped extended pinned layer.

Figure 8:
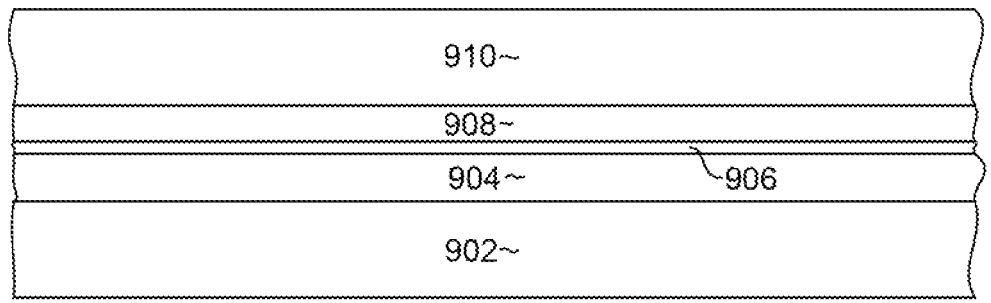
FIG. 8-25 are views of a magnetic read sensor in various intermediate stages of manufacture, illustrating a method of manufacturing a magnetic read sensor according to an embodiment of the invention.

FIGS. 8-20 illustrate a magnetic sensor in various intermediate stages of manufacture, illustrating a method for manufacturing a magnetic sensor according to an embodiment of the invention. With particular reference to FIG. 8, a bottom shield 902 is formed. A first series of sensor layers 904 is deposited over the shield. This first series of sensor layers 802 corresponds to the pinned layer structure 308, AFM layer 324 and seed layer 316 described above with reference to FIG. 3 and will be referred to herein simply as a pinned layer 904 for purposes of simplicity. A non-magnetic barrier or spacer layer 906 is deposited over the pinned layer 904, and a layer 908 is deposited over the barrier or spacer layer 906. The layer 908 includes the free layer 310 and capping layer 314 described above with reference to FIG. 3, and will be referred to herein simply as a free layer 908. A mask layer 910 is then deposited over the free layer 908. The mask layer includes a photoresist material, but may include other layers (not shown) such as one or more hard masks, anti-reflective layers and/or adhesion layers, and a CMP stop layer such as DLC.

Figure 9:
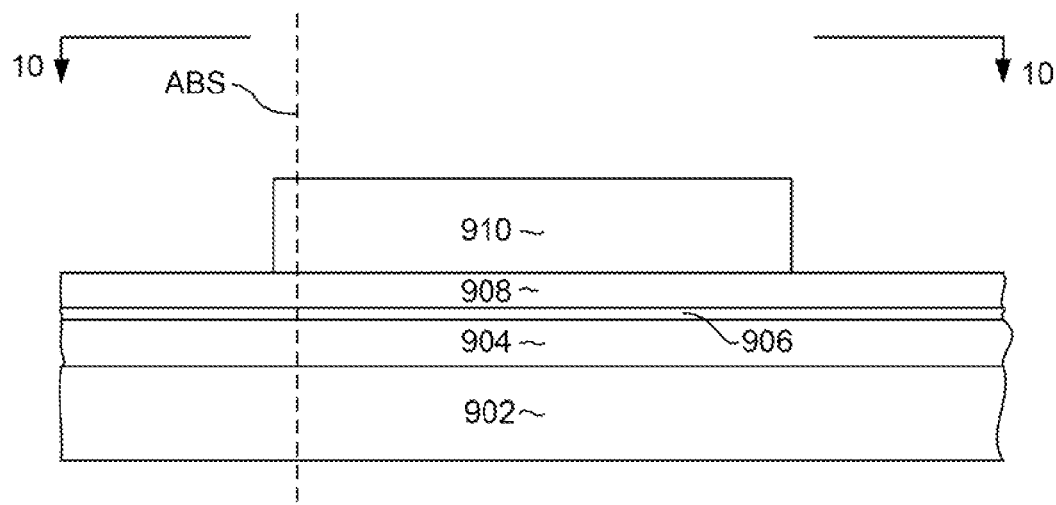
Figure 10:
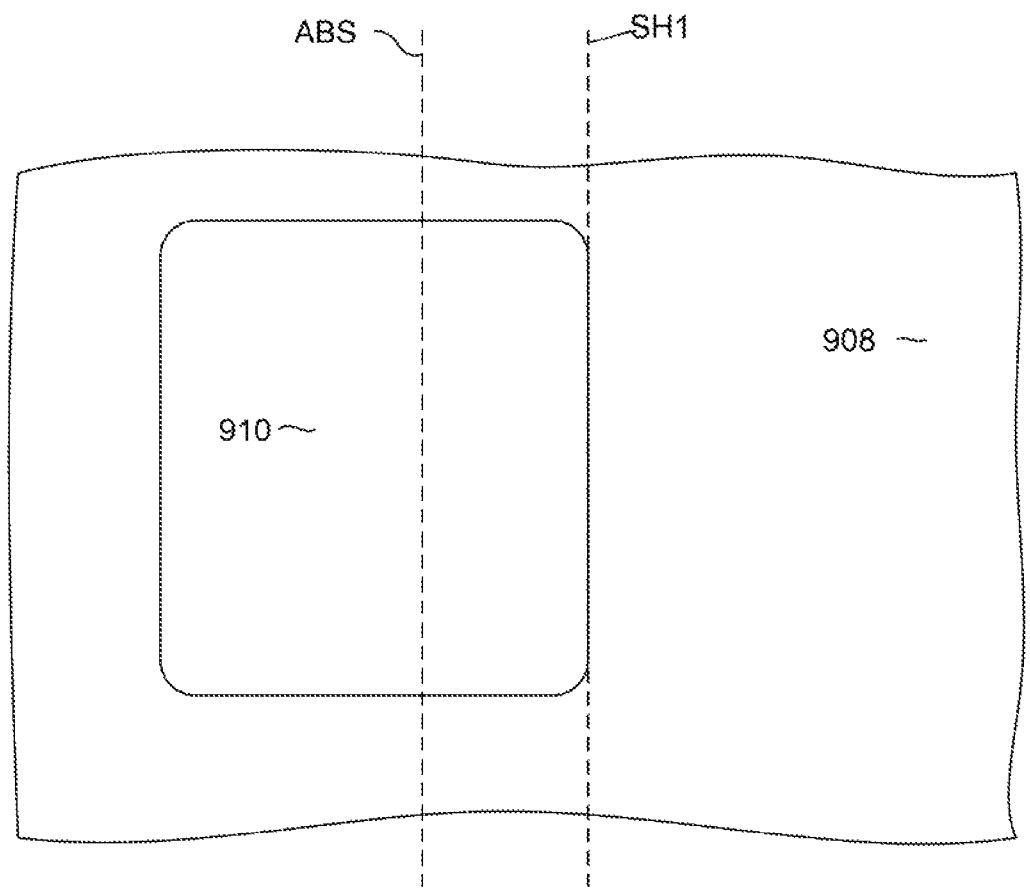

With reference now to FIGS. 9 and 10, the mask is patterned so as to define a stripe height of the sensor. FIG. 9 shows a side cross sectional view of a plane perpendicular to the air bearing surface, and FIG. 10 shows a top down view as seen from line 10-10 of FIG. 9. In FIGS. 9 and 10, the location of the intended air bearing surface plane is indicated by dashed line ABS. However, as those skilled in the art will appreciate, the actual air bearing surface will be formed much later in the build process by a slicing and lapping operation after all of the other structures of the read and write heads have been formed. The mask edge is configured to define the stripe height of the read sensor (e.g. back edge of the free layer).

Figure 11:
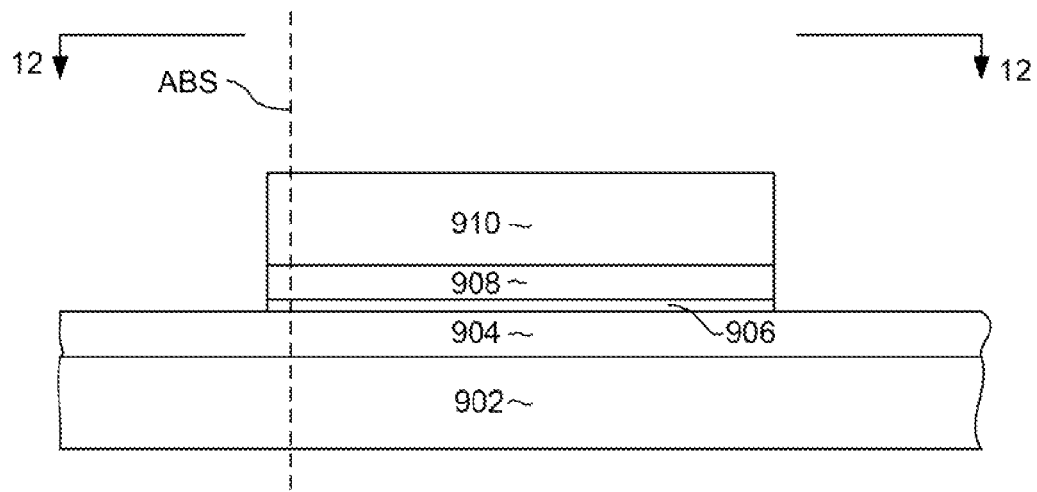
Figure 12:
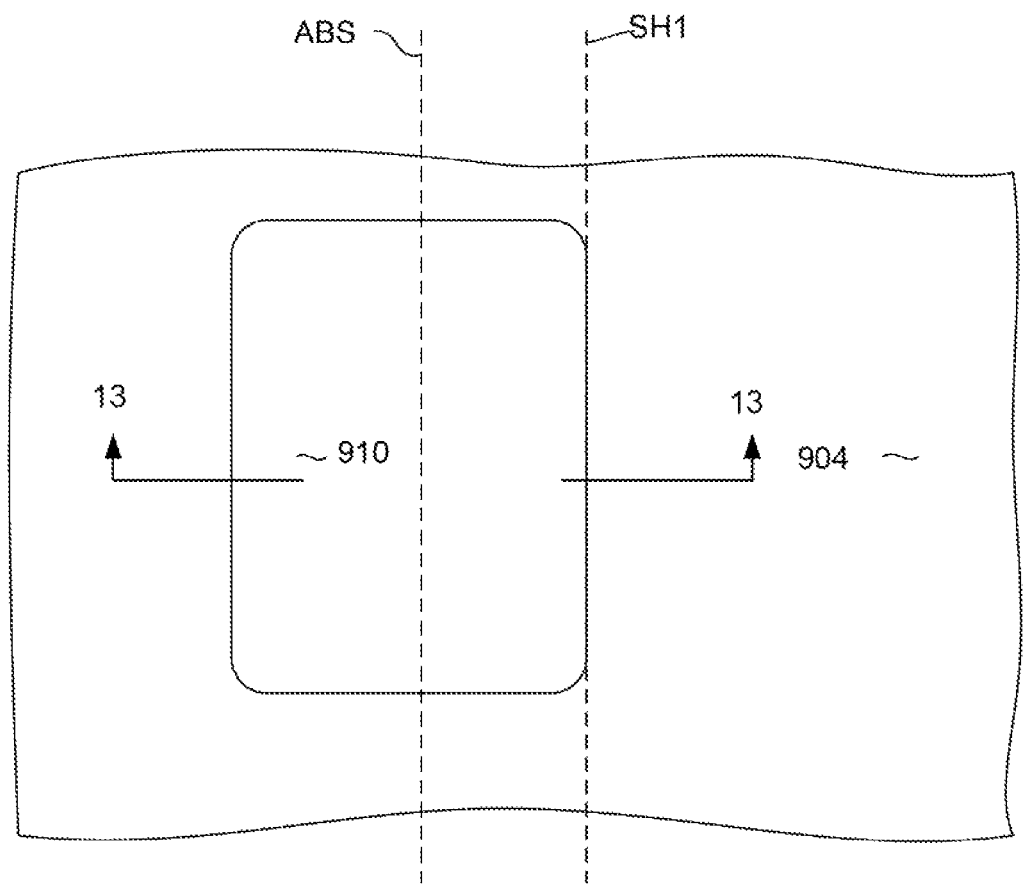

Then, with reference to FIGS. 11 and 12, a material removal process such as ion milling is performed to remove portions of the free layer 908 that are not protected by the mask 910 (e.g. portions that are exposed through the openings in the mask 910). The non-magnetic barrier/spacer layer 906 may be removed as shown in FIGS. 11 and 12 or may be left entirely or partially intact. The material of the non-magnetic layer 906 can be used as an end point detection layer to determine when ion milling should be terminated.

Figure 13:
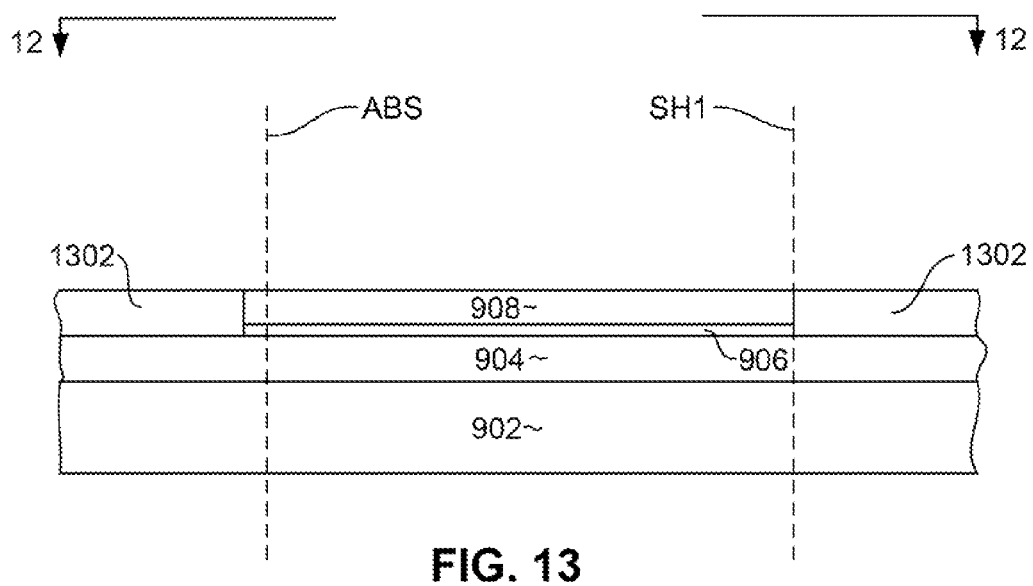
Figure 14:
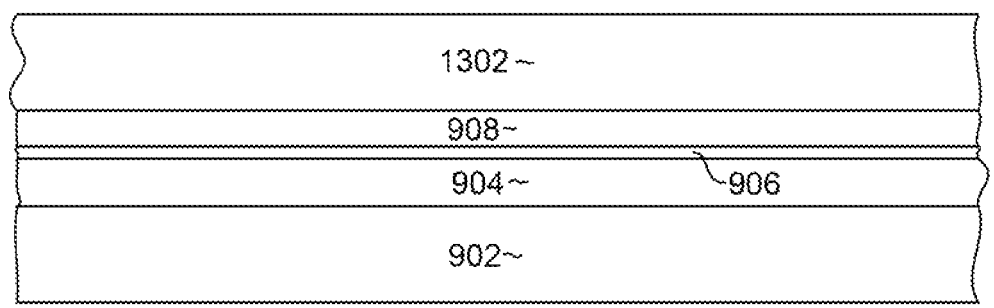
Figure 15:
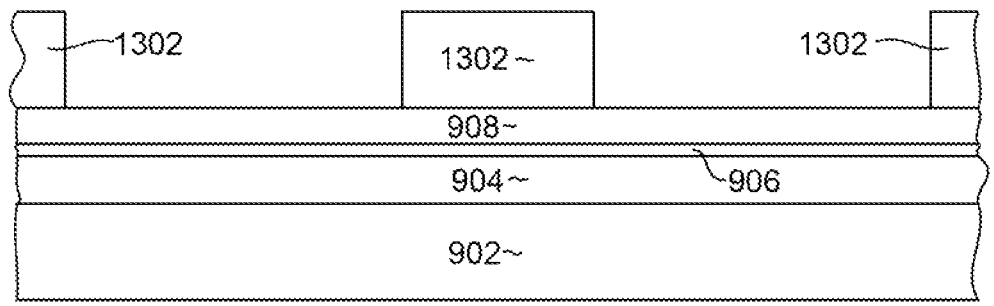
Figure 16:
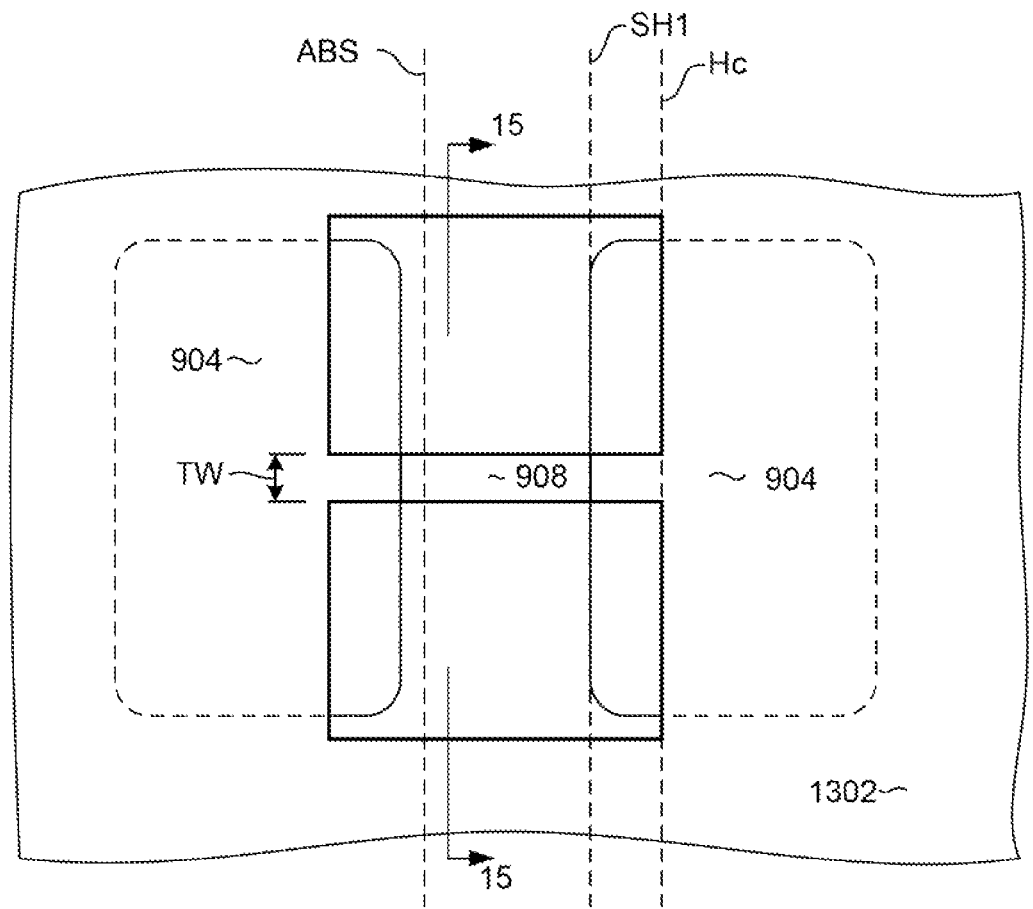

Then, after ion milling, an insulation layer 1302 consisting of a multilayer of one layer of alumina and another layer consisting of TaOx, SixNy, or combination are deposited following by DLC deposition, a CMP stop layer. A chemical mechanical polishing process (CMP) can be performed and follow by RIE to remove DLC to leaving a structure as shown in FIG. 13. With reference to FIG. 14, a second mask material 1302 is deposited. As before, the mask 1302 includes a photoresist material, but may include other materials such as hard mask layers anti-reflective coatings adhesion layers, CMP stop layer, etc. Then, with reference to FIGS. 15 and 16, the mask 1302 is patterned to define a sensor track width. FIG. 15 shows a plane that is parallel with the air bearing surface. As seen in FIG. 16, the mask 1302 has openings that are shaped so as to not only define the track width TW but also to define the shape of the extended pinned layer 308 and extended hard bias layers 326, 328 described above with reference to FIGS. 5-7.

Figure 17:
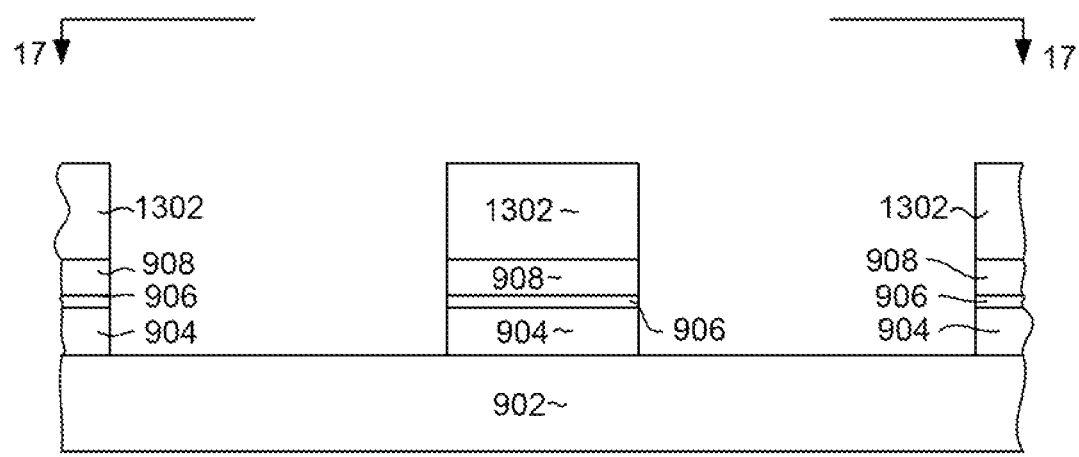
Figure 18:
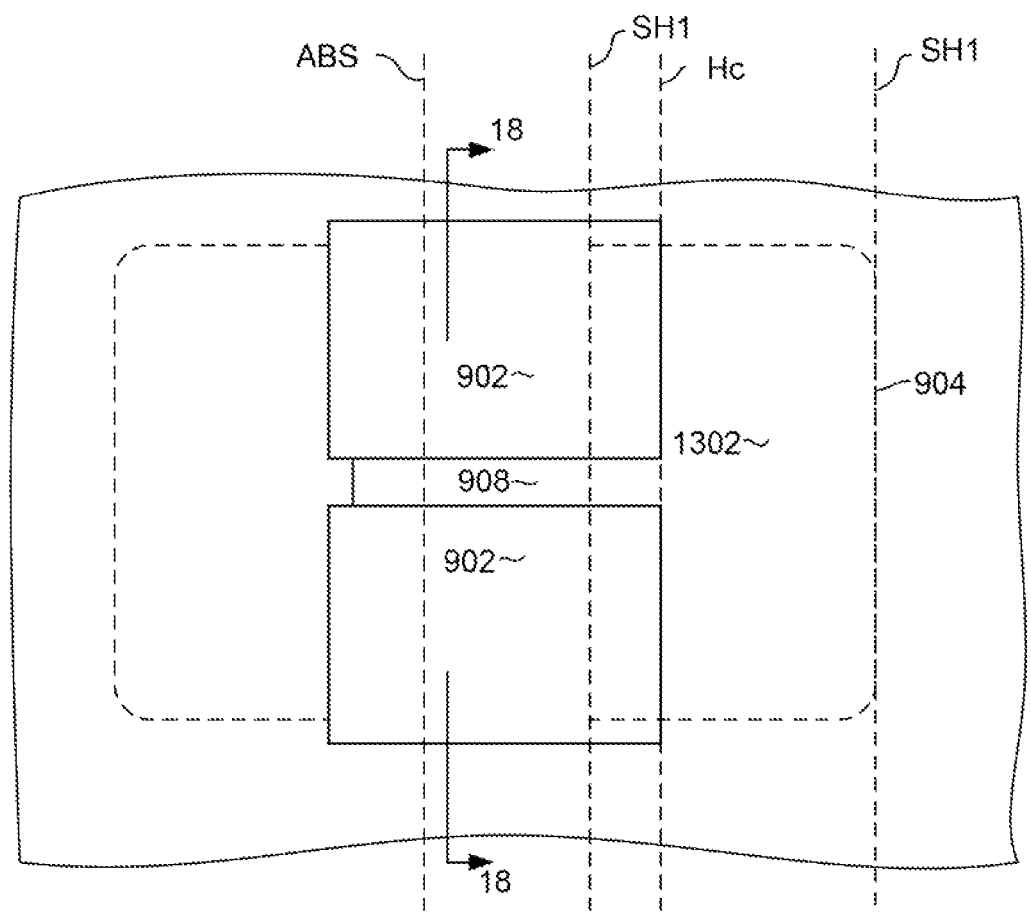

With reference now to FIGS. 17 and 18 a second material removal process such as ion milling is performed to remove portions of the free layer 908, spacer layer 906 and pinned layer 904 that are not protected by the second mask 1302. It should also be understood that some of the exposed portions have already had the free layer 908 removed so only the pinned layer 904 would be removed in these locations.

Figure 19:
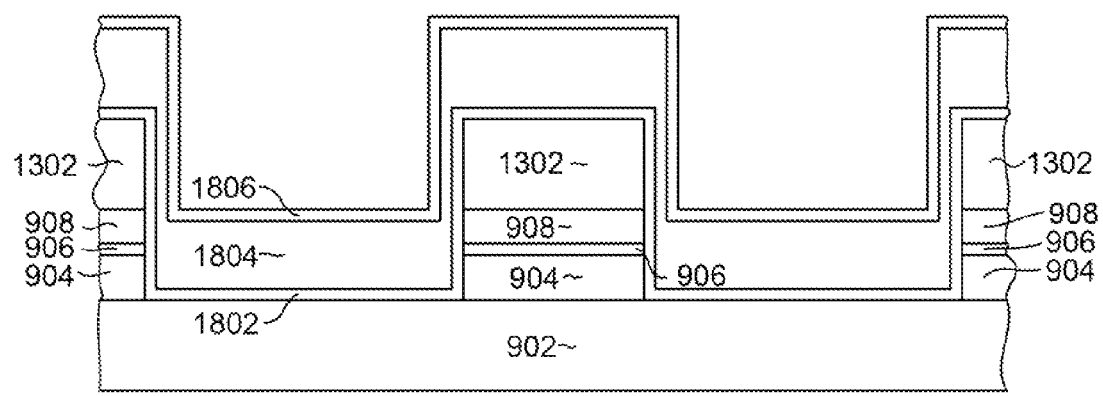
Figure 20:
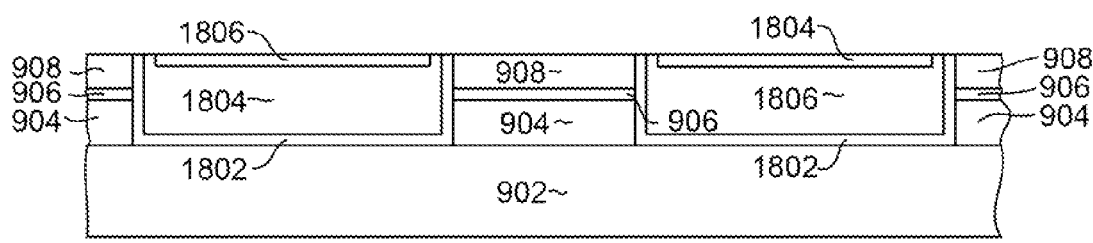
Figure 21:
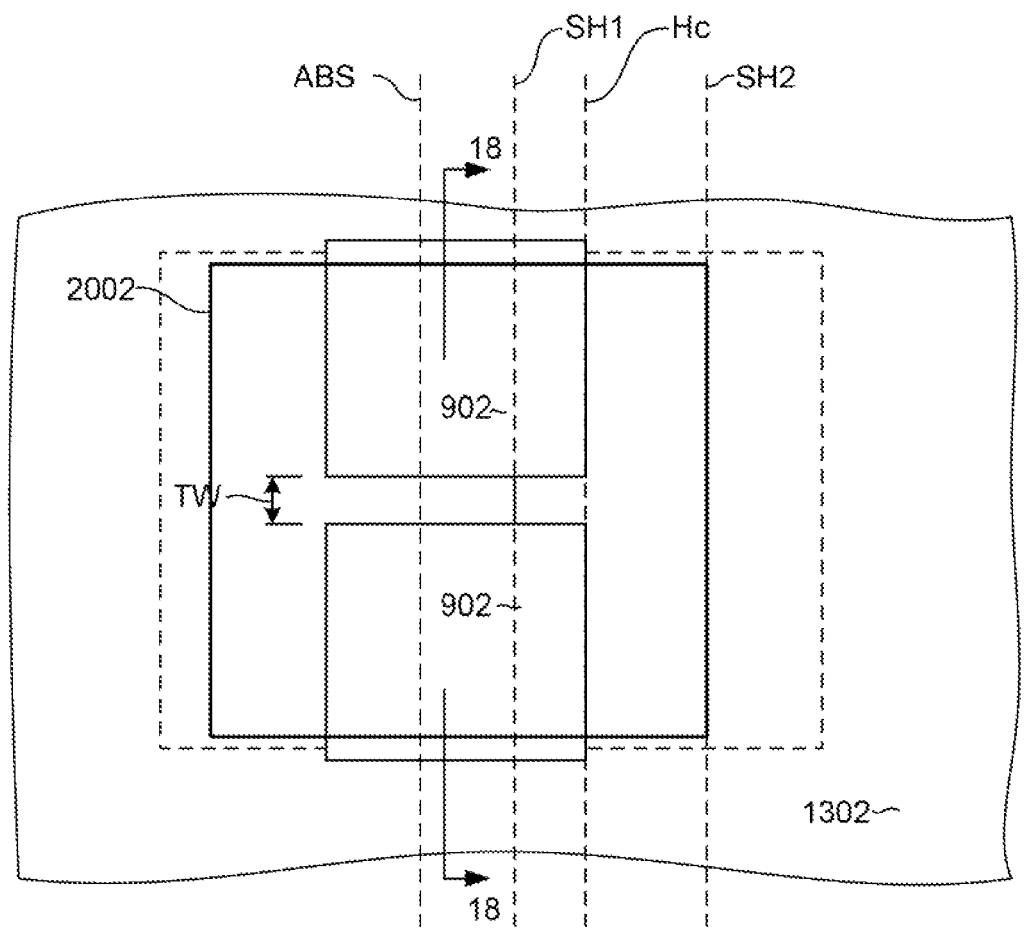
Figure 22:
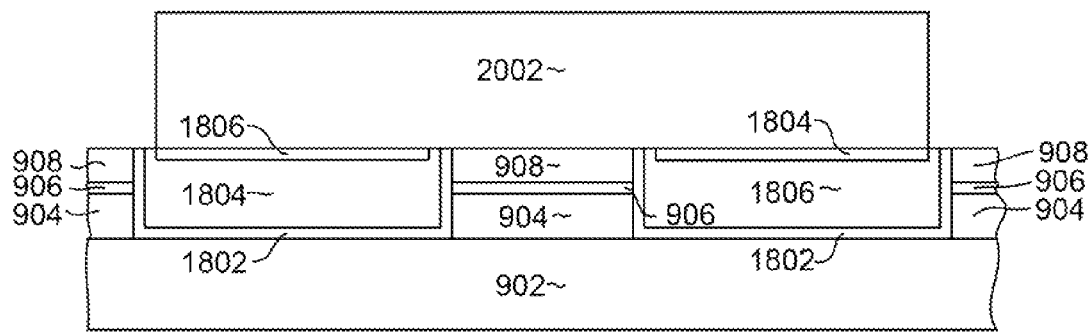
Figure 23:
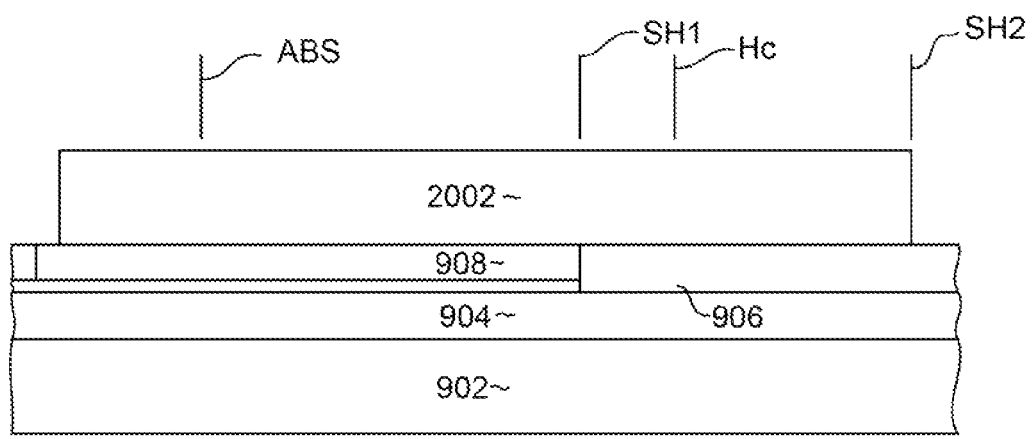
Figure 24:
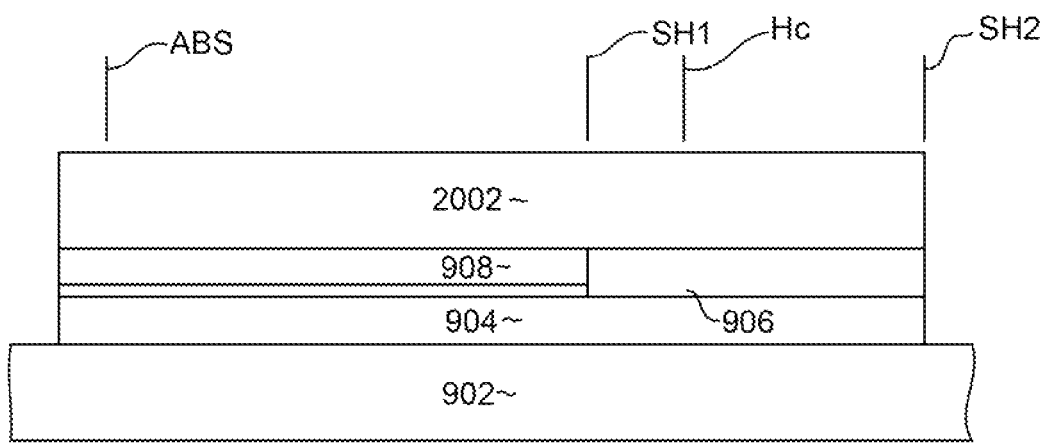

FIG. 19 shows a cross sectional view along a plane that is parallel with the ABS as seen from line 18-18 of FIG. 18. As shown in FIG. 19, a thin non-magnetic, electrically insulating material layer 1802 is deposited, preferably by a conformal deposition process such as atomic layer deposition (ALD) or ion beam deposition of AlOx, TaOx, SixNy, or their combination. Then, a magnet hard bias material 1804 is deposited over the insulation layer 1802. The magnetic hard bias material 1804 is a magnetic material having a high magnetic coercivity, such as CoPt or CoPtCr. Then, a hard bias capping layer 1806 is deposited over the magnetic hard bias material 1804. The hard bias material 1804 can also be replaced with soft bias material such as NiFe, CoFe, NiFeMo, or the combination in a single or bilayer. The capping layer 1806 can be a material such as Ta/Rh or Ta/Cr or combination, follow by deposition of DLC, a CMP stop layer Then, a chemical mechanical polishing process (CMP) can be performed then RIE to remove DLC, leaving a structure as shown in FIG. 20. Thereafter, with reference to FIGS. 21, 22 and 23 a third mask structure 2002 can be formed. This mask 2002 covers the sensor area and hard bias and extended pinned layer. The third mask has an edge that defines the pinned length stripe height, SH2 and leaves a field region (the region further from the sensor) uncovered. As shown in FIG. 24, an ion milling can then be performed to remove sensor material not protected by the mask and an insulation layer such as alumina can be deposited. This process can include a CMP to remove the mask or a liftoff process. If a CMP process is used, a CMP stop layer such as carbon can be deposited over the insulation layer and mask 2002, and then a chemical mechanical polishing process (CMP can be used to remove the mask. The remaining CMP stop layer can then be removed by a quick reactive ion etching. Alternatively, the mask 2002 can be constructed as a bi-layer mask having an overhang. After the insulation layer has been deposited, the mask can be lifted off, such as by PMGI. The overhang of the mask allows for the liftoff, by allowing PMGI liftoff solution to reach under the deposited insulation layer to reach the mask 2002.

Figure 25:
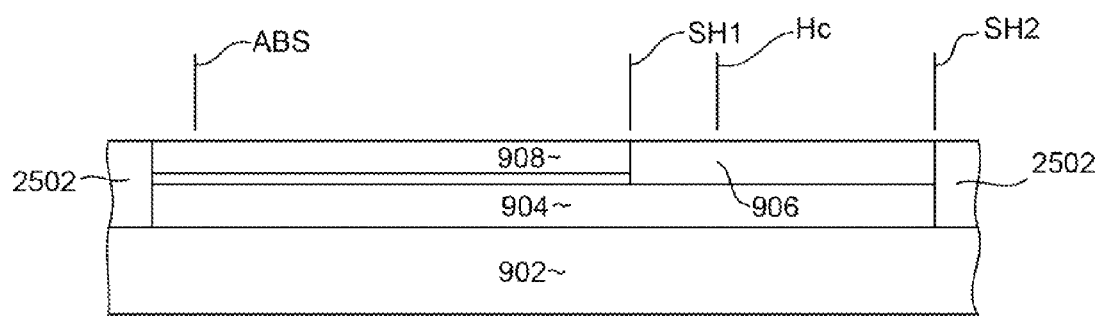

A non-magnetic, electrically insulating fill material such as alumina 2502 can then be deposited and a chemical mechanical polishing process can be performed, leaving a structure as shown in FIG. 25.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic read sensor, comprising:
    a sensor stack comprising a magnetic pinned layer structure, a magnetic free layer structure and a non-magnetic layer disposed between the magnetic pinned layer structure and magnetic free layer structure, the sensor stack having first and second sides, the free layer having a back edge terminating at a first stripe height as measured from an air bearing surface, and the pinned layer structure having an extended portion that extends beyond the first stripe height to a second stripe height; and
    first and second hard bias structures separated from the first and second sides of the sensor stack by first and second insulation layers, the hard bias structures having a back edge that defines a hard bias stripe height that is longer than the first stripe height, but shorter than the second stripe height.

2. A method for manufacturing the magnetic read sensor as in claim 1, the method comprising:
    depositing a series of sensor layers, the series of sensor layers including a pinned layer structure, a non-magnetic layer formed over the pinned layer structure and a free layer structure over the non-magnetic layer;
    forming a first mask structure over the series of sensor layers, the first mask structure being configured to define a stripe height of the free layer structure;
    performing a first ion milling to remove portions of the free layer structure that are not protected by the first mask structure thereby defining a free layer stripe height, the first ion milling being terminated before removing the pinned layer structure;
    forming a second mask structure, over the series of sensor layers, the second mask structure being configured to define a sensor track width and having a portion extending beyond the free layer stripe height that is configured to define an extended pinned layer shape; and
    performing a second ion milling, the second ion milling being performed sufficiently to remove portions of the free layer structure, non-magnetic layer and pinned layer structure that are not protected by the second mask structure.

3. The method as in claim 2, further comprising after performing the second ion milling, depositing a thin, non-magnetic, electrically insulating layer and depositing a magnetic bias material over the thin, non-magnetic, electrically insulating layer.

4. The method as in claim 3, further comprising after performing the second ion milling, depositing a thin, non-magnetic, electrically insulating layer, depositing a magnetic bias material over the thin, non-magnetic, electrically insulating layer, and depositing a hard bias capping layer over the magnetic bias material.

5. The method as in claim 4, further comprising, after depositing the hard bias capping layer:
    performing a chemical mechanical polishing;
    forming a third mask structure configured to cover a sensor area, extended pinned layer area and a hard bias area and leaving a kerf region uncovered; and
    performing a third ion milling to remove portions of the series of sensor layers that are not protected by the third mask structure.

\* \* \* \* \*